(12) United States Patent
Aisenbrey

(10) Patent No.: US 7,223,144 B2
(45) Date of Patent: May 29, 2007

(54) LOW COST SPARK PLUG MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 0 days.

(21) Appl. No.: 11/131,525

(22) Filed: May 18, 2005

(65) Prior Publication Data

US 2005/0208862 A1  Sep. 22, 2005

Related U.S. Application Data

(63) Continuation-in-part of application No. 10/877,092, filed on Jun. 25, 2004, which is a continuation of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/574,336, filed on May 25, 2004, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H01T 4/04* (2006.01)

(52) U.S. Cl. ........................................... 445/7

(58) Field of Classification Search ................ 313/118, 313/129, 130, 141; 445/7
See application file for complete search history.

(56) References Cited

U.S. PATENT DOCUMENTS

| 2,122,960 A | * | 7/1938 | Schwartzwalder | ....... 156/89.11 |
| 4,406,968 A | | 9/1983 | Friese et al. | ................. 313/136 |

(Continued)

FOREIGN PATENT DOCUMENTS

GB  2377449  7/2001

OTHER PUBLICATIONS

Co-pending U.S. Patent Int-04-020 A, "Low Cost Spark Plug Manufactured From Conductive Loaded Resin-Based Materials", U.S. Appl. No. 11/131,523, filed May 18, 2005, Assigned to the Same Assignee as the Present Invention.

*Primary Examiner*—Nimeshkumar D. Patel
*Assistant Examiner*—Matt Hodges
(74) *Attorney, Agent, or Firm*—Douglas Schnabel

(57) ABSTRACT

Spark plug devices are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are metals or conductive non-metals or metal plated non-metals. The micron conductive fibers may be metal fiber or metal plated fiber. Further, the metal plated fiber may be formed by plating metal onto a metal fiber or by plating metal onto a non-metal fiber. Any platable fiber may be used as the core for a non-metal fiber. Superconductor metals may also be used as micron conductive fibers and/or as metal plating onto fibers in the present invention.

23 Claims, 5 Drawing Sheets

U.S. PATENT DOCUMENTS

| | | | |
|---|---|---|---|
| 4,882,227 A * | 11/1989 | Iwase et al. | 428/407 |
| 5,217,397 A | 6/1993 | Itoh | 439/865 |
| 5,237,982 A | 8/1993 | Asakura et al. | 123/635 |
| 5,254,409 A * | 10/1993 | Yagi et al. | 428/392 |
| 5,952,770 A * | 9/1999 | Mueller et al. | 313/141 |
| 2002/0043398 A1* | 4/2002 | Nakagawa et al. | 174/256 |

* cited by examiner

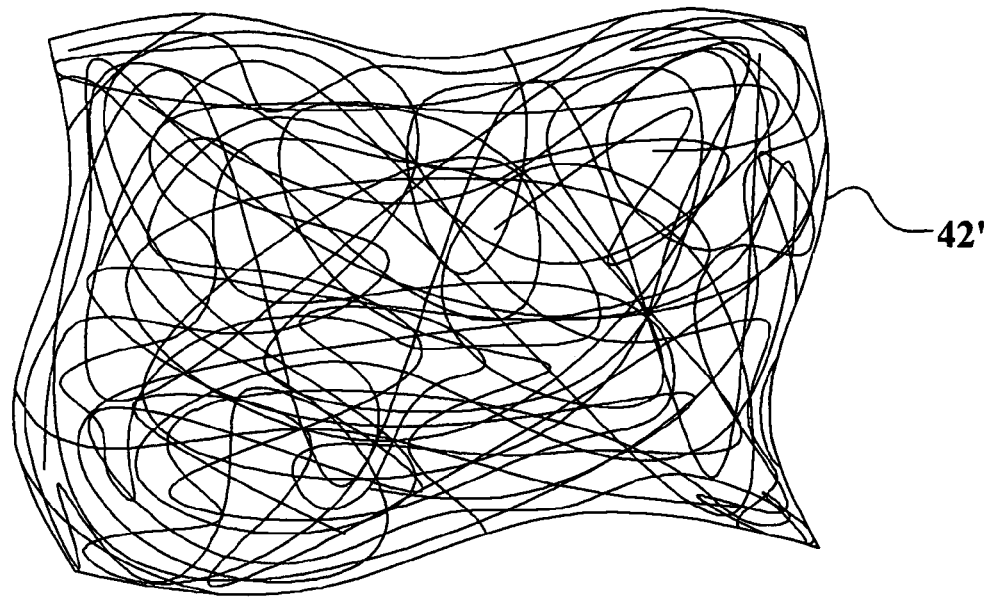
FIG. 5b
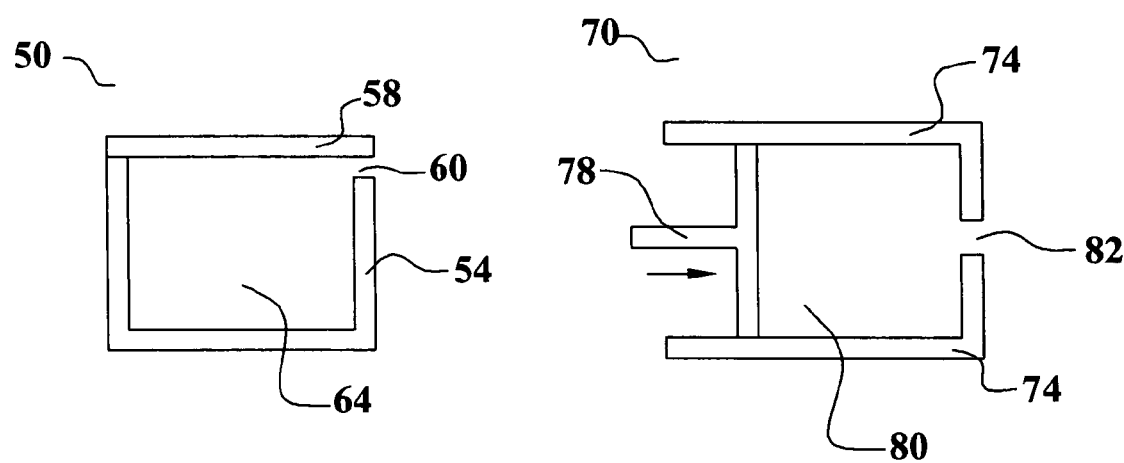
FIG. 6a  FIG. 6b

LOW COST SPARK PLUG MANUFACTURED FROM CONDUCTIVE LOADED RESIN-BASED MATERIALS

RELATED PATENT APPLICATIONS

This Patent Application is related to U.S. patent application Ser. No. 11/131,523, and filed on May 18, 2005, which is herein incorporated by reference in its entirety.

This patent application claims priority to the U.S. Provisional Patent Application 60/574,336, filed on May 25, 2004, which is herein incorporated by reference in its entirety.

This patent application is a Continuation-in-Part of INT01-002CIPC, filed as U.S. patent application Ser. No. 10/877,092, filed on Jun. 25, 2004, which is a Continuation of INT01-002CIP, filed as U.S. patent application Ser. No. 10/309,429, filed on Dec. 4, 2002, now issued as U.S. Pat. No. 6,870,516, also incorporated by reference in its entirety, which is a Continuation-in-Part application of docket number INT01-002, filed as U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001, all of which are incorporated by reference in their entirety.

BACKGROUND OF THE INVENTION (1) Field of the Invention

This invention relates to spark plug devices and, more particularly, to spark plug devices molded of conductive loaded resin-based materials comprising micron conductive powders, micron conductive fibers, or a combination thereof, substantially homogenized within a base resin when molded. This manufacturing process yields a conductive part or material usable within the EMF or electronic spectrum(s).

(2) Description of the Prior Art

A spark plug is commonly used in the automotive industry in the cylinder head of an internal-combustion engine. A spark plug carries electrodes separated by an air gap across which the current from the ignition system discharges to form the spark for combustion. It is widely accepted in the automotive industry that spark plugs provide two primary functions. The first function of the spark plug is to ignite the air/fuel mixture. The second function is to remove heat from the combustion chamber.

Spark plugs are typically designed to function with the insulator tip and center electrode temperature within the ideal heat range of approximately 500 degrees C. (930 degrees F.) to approximately 850 degrees C. (1560 degrees F.). Temperatures in excess of approximately 1050 degrees C. (1920 degrees F.) tend to cause pre-ignition of the air/fuel mixture in the combustion chamber which has a detrimental effect on engine performance. Temperatures below approximately 400 degrees C. (750 degrees F.) tend to foul the insulator tip and center electrode with carbon and oil deposits which also have a detrimental effect on performance. The spark plug should also be designed to maintain optimal operating temperatures. A primary purpose of the present invention is to provide an improved spark plug device comprising a novel material.

Several prior art inventions relate to spark plug devices. U.S. Pat. No. 4,406,968 to Friese et al teaches a spark plug for an internal combustion engine. U.S. Pat. No. 5,237,982 to Asakura et al teaches an ignition apparatus for an internal combustion engine. U.S. Pat. No. 5,217,397 to Itoh teaches a connection construction for a high-voltage resistance wire as can be used for an engine ignition system.

SUMMARY OF THE INVENTION

A principal object of the present invention is to provide an effective spark plug device.

A further object of the present invention is to provide a method to form a spark plug device.

A further object of the present invention is to provide a spark plug device molded of conductive loaded resin-based materials.

A further object of the present invention is to provide a spark plug with improved electrical firing.

A further object of the present invention is to provide a spark plug with an integrated center electrode resistor.

A yet further object of the present invention is to provide a spark plug device molded of conductive loaded resin-based material where the electrical or mechanical characteristics can be altered or the visual characteristics can be altered by forming a metal layer over the conductive loaded resin-based material.

A yet further object of the present invention is to provide methods to fabricate a spark plug device from a conductive loaded resin-based material incorporating various forms of the material.

In accordance with the objects of this invention, a spark plug device is achieved. The device comprises a center electrode comprising a conductive loaded, resin-based material comprising conductive materials in a base resin host. A grounding electrode is separated at a first location from the center electrode by a gap. An insulator separates the center electrode and the grounding electrode at a second location.

Also in accordance with the objects of this invention, a spark plug device is achieved. The device comprises a center electrode. A grounding electrode is separated at a first location from the center electrode by a gap comprising a conductive loaded, resin-based material comprising conductive materials in a base resin host. An insulator separates the center electrode and the grounding electrode at a second location.

Also in accordance with the objects of this invention, a spark plug device is achieved. The device comprises a center electrode comprising a conductive loaded, resin-based material comprising conductive materials in a base resin host. The percent by weight of the conductive materials is between about 20% and about 50% of the total weight of the conductive loaded resin-based material. A grounding electrode is separated at a first location from the center electrode by a gap. An insulator separates the center electrode and the grounding electrode at a second location.

Also in accordance with the objects of this invention, a method to form a spark plug device is achieved. The method comprises providing a conductive loaded, resin-based material comprising conductive materials in a resin-based host. The conductive loaded, resin-based material is molded into a spark plug device. This device comprises a center electrode comprising the conductive loaded, resin-based material. A grounding electrode is separated at a first location from the center electrode by a gap. An insulator separates the center electrode and the grounding electrode at a second location.

Also in accordance with the objects of this invention, a method to form a conductive fastening device is achieved. The method comprises providing a conductive loaded, resinbased material comprising conductive materials in a resin-based host. The percent by weight of the conductive materials is between 20% and 40% of the total weight of the conductive loaded resin-based material. The conductive loaded, resin-based material is molded into a spark plug device. The device comprises a center electrode. A grounding electrode is separated at a first location from the center electrode by a gap. The grounding electrode comprises the conductive loaded, resin-based material. An insulator separates the center electrode and the grounding electrode at a second location.

Also in accordance with the objects of this invention, a method to form a conductive fastening device is achieved. The method comprises providing a conductive loaded, resin-based material comprising micron conductive fiber in a resin-based host. The percent by weight of the micron conductive fiber is between 20% and 50% of the total weight of the conductive loaded resin-based material. The conductive loaded, resin-based material is molded into a conductive fastening device. The device comprises a center electrode comprising the conductive loaded, resin-based material. A grounding electrode is separated at a first location from the center electrode by a gap. An insulator separates the center electrode and the grounding electrode at a second location.

BRIEF DESCRIPTION OF THE DRAWINGS

In the accompanying drawings forming a material part of this description, there is shown:

FIGS. 5a and 5b illustrate a fourth preferred embodiment wherein conductive fabric-like materials are formed from the conductive loaded resin-based material.

FIGS. 6a and 6b illustrate, in simplified schematic form, an injection molding apparatus and an extrusion molding apparatus that may be used to mold spark plug devices of a conductive loaded resin-based material.

DESCRIPTION OF THE PREFERRED EMBODIMENTS

Figure 1:
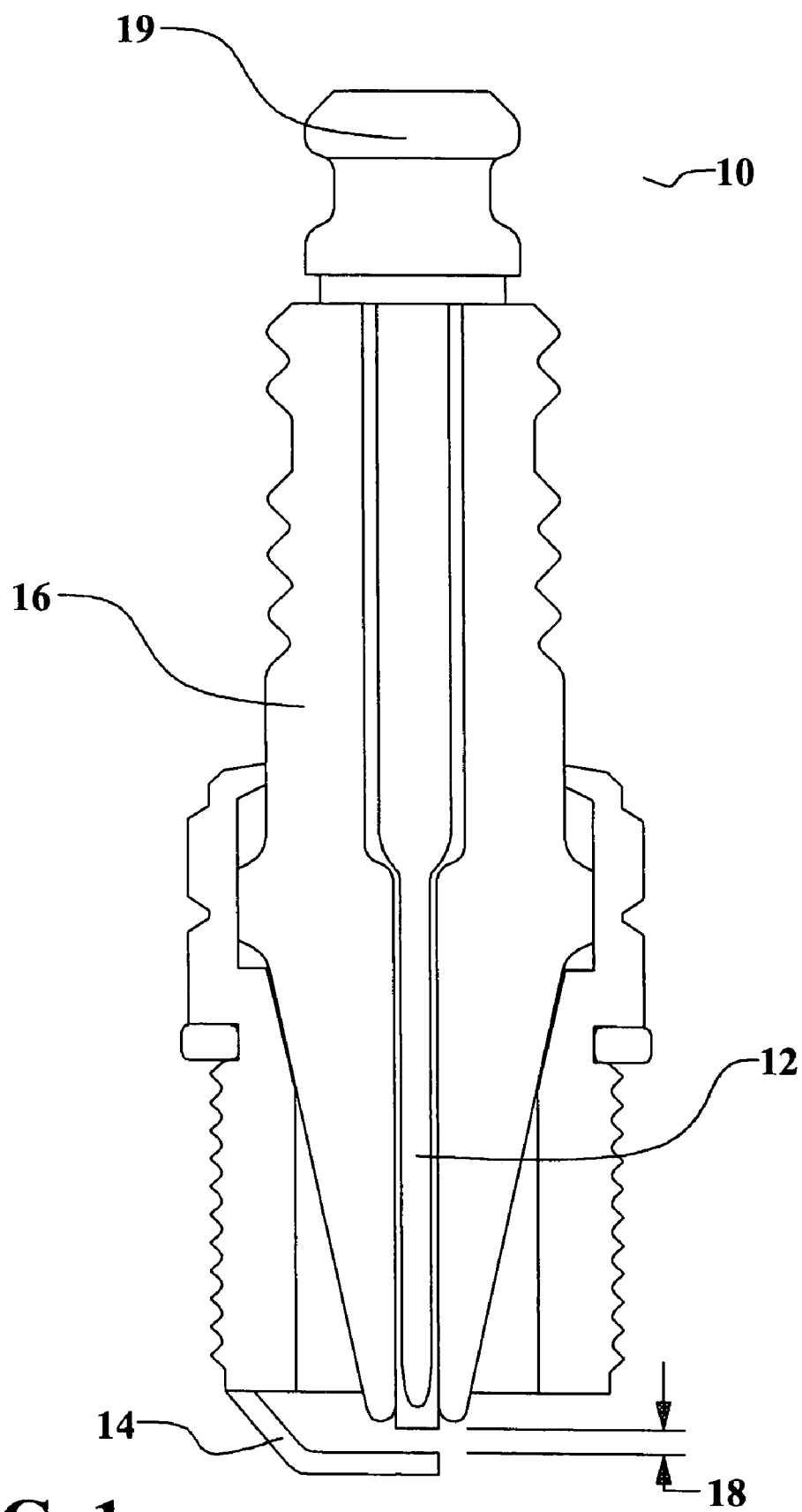
FIG. 1 illustrates a first preferred embodiment of the present invention showing a spark plug device having components formed of conductive loaded resin-based material according to the present invention.

This invention relates to spark plug devices molded of conductive loaded resin-based materials comprising micron conductive powders, micron conductive fibers, or a combination thereof, substantially homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are substantially homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of spark plug devices fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the spark plug devices are substantially homogenized together using molding techniques and or methods such as injection molding, over-molding, insert molding, thermo-set, protrusion, extrusion, calendaring, or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed materials(s).

In the conductive loaded resin-based material, electrons travel from point to point when under stress, following the path of least resistance. Most resin-based materials are insulators and represent a high resistance to electron passage. The doping of the conductive loading into the resin-based material alters the inherent resistance of the polymers. At a threshold concentration of conductive loading, the resistance through the combined mass is lowered enough to allow electron movement. Speed of electron movement depends on conductive loading concentration, that is, the separation between the conductive loading particles. Increasing conductive loading content reduces interparticle separation distance, and, at a critical distance known as the percolation point, resistance decreases dramatically and electrons move rapidly.

Resistivity is a material property that depends on the atomic bonding and on the microstructure of the material. The atomic microstructure material properties within the conductive loaded resin-based material are altered when molded into a structure. A substantially homogenized conductive microstructure of delocalized valance electrons is created. This microstructure provides sufficient charge carriers within the molded matrix structure. As a result, a low density, low resistivity, lightweight, durable, resin based polymer microstructure material is achieved. This material exhibits conductivity comparable to that of highly conductive metals such as silver, copper or aluminum, while maintaining the superior structural characteristics found in many plastics and rubbers or other structural resin based materials.

The use of conductive loaded resin-based materials in the fabrication of spark plug devices significantly lowers the cost of materials and the design and manufacturing processes used to hold ease of close tolerances, by forming these materials into desired shapes and sizes. The spark plug devices can be manufactured into infinite shapes and sizes using conventional forming methods such as injection molding, over-molding, or extrusion, calendaring, or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are substantially homogenized together within the base resin, during the molding process, yielding an easy to produce low cost, electrically conductive, close tolerance manufactured part or circuit. The resulting molded article comprises a three dimensional, continuous network of conductive loading and polymer matrix. Exemplary micron conductive powders include carbons, graphites, amines or the like, and/or of metal powders such as nickel, copper, silver, aluminum, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The addition of conductive powder to the micron conductive fiber loading may increase the surface conductivity of the molded part, particularly in areas where a skinning effect occurs during molding.

The micron conductive fibers may be metal fiber or metal plated fiber. Further, the metal plated fiber may be formed by plating metal onto a metal fiber or by plating metal onto a non-metal fiber. Exemplary metal fibers include, but are not limited to, stainless steel fiber, copper fiber, nickel fiber, silver fiber, aluminum fiber, or the like, or combinations thereof. Exemplary metal plating materials include, but are not limited to, copper, nickel, cobalt, silver, gold, palladium, platinum, ruthenium, and rhodium, and alloys of thereof. Any platable fiber may be used as the core for a non-metal fiber. Exemplary non-metal fibers include, but are not limited to, carbon, graphite, polyester, basalt, man-made and naturally-occurring materials, and the like. In addition, superconductor metals, such as titanium, nickel, niobium, and zirconium, and alloys of titanium, nickel, niobium, and zirconium may also be used as micron conductive fibers and/or as metal plating onto fibers in the present invention. The structural material is a material such as any high temperature polymer resin.

The resin-based structural material loaded with micron conductive powders, micron conductive fibers, or in combination thereof can be molded, using conventional molding methods such as injection molding or over-molding, or extrusion, or calendaring, to create desired shapes and sizes. The molded conductive loaded resin-based materials can also be stamped, cut or milled as desired to form create the desired shape form factor(s) of the spark plug devices. The doping composition and directionality associated with the micron conductors within the loaded base resins can affect the electrical and structural characteristics of the spark plug devices and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming spark plug devices that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in spark plug devices applications as described herein.

The substantially homogeneous mixing of micron conductive fiber and/or micron conductive powder and base resin described in the present invention may also be described as doping. That is, the substantially homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the substantially homogeneous mixing of micron conductive fiber and/or micron conductive powder into a base resin.

As an additional and important feature of the present invention, the molded conductor loaded resin-based material exhibits excellent thermal dissipation characteristics. Therefore, spark plug devices manufactured from the molded conductor loaded resin-based material can provide added thermal dissipation capabilities to the application. For example, heat can be dissipated from electrical devices physically and/or electrically connected to spark plug devices of the present invention.

As a significant advantage of the present invention, spark plug devices constructed of the conductive loaded resin-based material can be easily interfaced to an electrical circuit or grounded. In one embodiment, a wire can be attached to a conductive loaded resin-based spark plug devices via a screw that is fastened to the spark plug devices. For example, a simple sheet-metal type, self tapping screw, when fastened to the material, can achieve excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw that is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the spark plug devices and a grounding wire.

Where a metal layer is formed over the surface of the conductive loaded resin-based material, any of several techniques may be used to form this metal layer. This metal layer may be used for visual enhancement of the molded conductive loaded resin-based material article or to otherwise alter performance properties. Well-known techniques, such as electroless metal plating, electro metal plating, metal vapor deposition, metallic painting, or the like, may be applied to the formation of this metal layer. If metal plating is used, then the resin-based structural material of the conductive loaded, resin-based material is one that can be metal plated. There are many of the polymer resins that can be plated with metal layers. Electroless plating is typically a multiple-stage chemical process where, for example, a thin copper layer is first deposited to form a conductive layer. This conductive layer is then used as an electrode for the subsequent plating of a thicker metal layer.

A typical metal deposition process for forming a metal layer onto the conductive loaded resin-based material is vacuum metallization. Vacuum metallization is the process where a metal layer, such as aluminum, is deposited on the conductive loaded resin-based material inside a vacuum chamber. In a metallic painting process, metal particles, such as silver, copper, or nickel, or the like, are dispersed in an acrylic, vinyl, epoxy, or urethane binder. Most resin-based materials accept and hold paint well, and automatic spraying systems apply coating with consistency. In addition, the excellent conductivity of the conductive loaded resin-based material of the present invention facilitates the use of extremely efficient, electrostatic painting techniques.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Another method to provide connectivity to the conductive loaded resin-based material is through the application of a solderable ink film to the surface. One exemplary solderable ink is a combination of copper and solder particles in an epoxy resin binder. The resulting mixture is an active, screen-printable and dispensable material. During curing, the solder reflows to coat and to connect the copper particles and to thereby form a cured surface that is directly solderable without the need for additional plating or other processing steps. Any solderable material may then be mechanically and/or electrically attached, via soldering, to the conductive loaded resin-based material at the location of the applied solderable ink. Many other types of solderable inks can be used to provide this solderable surface onto the conductive loaded resin-based material of the present invention. Another exemplary embodiment of a solderable ink is a mixture of one or more metal powder systems with a reactive organic medium. This type of ink material is converted to solderable pure metal during a low temperature cure without any organic binders or alloying elements.

A ferromagnetic conductive loaded resin-based material may be formed of the present invention to create a magnetic or magnetizable form of the material. Ferromagnetic micron conductive fibers and/or ferromagnetic conductive powders are mixed with the base resin. Ferrite materials and/or rare earth magnetic materials are added as a conductive loading to the base resin. With the substantially homogeneous mixing of the ferromagnetic micron conductive fibers and/or micron conductive powders, the ferromagnetic conductive loaded resin-based material is able to produce an excellent low cost, low weight magnetize-able item. The magnets and magnetic devices of the present invention can be magnetized during or after the molding process. The magnetic strength of the magnets and magnetic devices can be varied by adjusting the amount of ferromagnetic micron conductive fibers and/or ferromagnetic micron conductive powders that are incorporated with the base resin. By increasing the amount of the ferromagnetic doping, the strength of the magnet or magnetic devices is increased. The substantially homogenous mixing of the conductive fiber network allows for a substantial amount of fiber to be added to the base resin without causing the structural integrity of the item to decline. The ferromagnetic conductive loaded resin-based magnets display the excellent physical properties of the base resin, including flexibility, moldability, strength, and resistance to environmental corrosion, along with excellent magnetic ability. In addition, the unique ferromagnetic conductive loaded resin-based material facilitates formation of items that exhibit excellent thermal and electrical conductivity as well as magnetism.

A high aspect ratio magnet is easily achieved through the use of ferromagnetic conductive micron fiber or through the combination of ferromagnetic micron powder with conductive micron fiber. The use of micron conductive fiber allows for molding articles with a high aspect ratio of conductive fiber to cross sectional area. If a ferromagnetic micron fiber is used, then this high aspect ratio translates into a high quality magnetic article. Alternatively, if a ferromagnetic micron powder is combined with micron conductive fiber, then the magnetic effect of the powder is effectively spread throughout the molded article via the network of conductive fiber such that an effective high aspect ratio molded magnetic article is achieved. The ferromagnetic conductive loaded resin-based material may be magnetized, after molding, by exposing the molded article to a strong magnetic field. Alternatively, a strong magnetic field may be used to magnetize the ferromagnetic conductive loaded resin-based material during the molding process.

The ferromagnetic conductive loading is in the form of fiber, powder, or a combination of fiber and powder. The micron conductive powder may be metal fiber or metal plated fiber. If metal plated fiber is used, then the core fiber is a platable material and may be metal or non-metal. Exemplary ferromagnetic conductive fiber materials include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive fiber materials. Exemplary ferromagnetic micron powder leached onto the conductive fibers include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive powder materials. A ferromagnetic conductive loading may be combined with a non-ferromagnetic conductive loading to form a conductive loaded resin-based material that combines excellent conductive qualities with magnetic capabilities.

As another important feature of the present invention, in very high temperature applications, the conductive loaded resin-based material of the present invention must comprise a base resin with very high temperature capability. Resins are typically divided into two major groups known as thermoplastic and thermoset. Thermoplastic resins become soft when heated, may be shaped or molded while in a heated semi fluid state, and become rigid when cooled. Thermoset resins, on the other hand, are usually liquids or low-melting-point solids in their initial form. When used, these thermosetting resins are "cured" by the use of a catalyst, heat, or a combination of the two, such the resin becomes a solid. Thermoset resins cannot be converted back to their original liquid form. Of particular importance to the present invention, thermoset resin compounds can exhibit very high maximum operating temperatures that are substantially higher than thermoplastic resins. Therefore, in the present invention, thermoplastic resins with very high maximum operating temperatures are preferably used as the base resins in the conductive loaded resin-based material to form components, such as electrodes, in the spark plug devices.

Referring now to FIG. 1, a preferred embodiment of a very low cost spark plug formed of conductive loaded resin-based material is illustrated. Several important features of the present invention are shown and discussed below. The first preferred embodiment 10 of the present invention shows a spark plug 10 comprising a center electrode 12, a ground electrode 14, and an insulator 16. The airspace between the center electrode and ground electrode is commonly referred to as the spark gap 18. A center connector 19 is electrically connected to the center electrode 12.

As a first preferred embodiment of the present invention, the center electrode 12 is fabricated of conductive loaded resin-based material. The conductive loaded resin-based center electrode 12 has very low resistance due to the conductive material(s) homogeneously mixed into the resin-based host. Further, the base resin is selected from those resins capable of withstanding the temperature range of the spark plug environment (400 degrees C. to 1050 degrees C.) while maintaining dimensional stability. Thermoplastic resin compounds having sufficiently high operating temperature are preferred. In addition, the conductive loaded resin-based material exhibits excellent thermal conductivity to thereby help maintain optimal operating temperature. Finally, the conductive loaded resin-based material exhibits excellent dimensional control and stability. Therefore, the exact spark gap can be established by molding and will be maintained. By comparison, many prior art spark plugs have electrodes that are somewhat malleable and that require gap checking/setting prior to installation in the engine.

In the prior art, the portion of the center electrode exposed to the spark may be plated with a metal such as, for example, platinum or iridium. This is done to improve spark characteristics and to improve dimensional stability of the gap over time. Similarly, the conductive loaded resin-based center electrode 12 of the present invention may be plated with a metal layer, not shown. This metal layer may be formed by plating or by coating. If the method of formation is metal plating, then the resin-based structural material of the conductive loaded, resin-based material is one that can be metal plated. There are very many of the polymer resins that can be plated with metal layers. This metal layer may be formed by, for example, electroplating or physical vapor deposition.

In the prior art, certain spark plugs utilize a resistive element of approximately 5,000-ohm built into the spark plug core in order to suppress spark-generated electromagnetic noise that could otherwise interfere with the vehicle's on-board electronics. In the present invention, the conductive loaded resin-based center electrode 12 eliminates the need for a separate resistive element in the spark plug core thus reducing manufacturing costs associated with spark plug fabrication. The conductive loaded resin-based center electrode 12 displays a resistance effect that can be fine tuned to the requirements of any particular application by selecting the doping material(s) and/or ratio of conductive loading to base resin to create the desired properties.

The present invention has been shown in laboratory testing to provide an omni-directional spark pattern. The conductive matrix lattice creates a vast number of launching points for sparking between the electrodes. This omni-directional spark pattern can be beneficial for propagating the spark from the center electrode 12 to the ground electrode 14. The conductive loaded resin-based center electrode 12 of the present invention may be formed into almost any shape that is beneficial for the application. The center electrode 12 shape, and more specifically the cross-sectional area of the tip of the center electrode 12, affects the spark generating properties of the spark plug. In the present invention, the shape of the tip of the center electrode 12 can be easily optimized to meet the sparking needs of various spark plug applications.

In a second preferred embodiment of the present invention, the ground electrode 14 of the spark plug 10 is formed of conductive loaded resin-based material. As with the center electrode 12, the ground electrode 14 may be formed into almost any shape that is beneficial for the application. In the prior art, certain spark plugs have been manufactured with a split in the exposed spark portion of the ground electrode 14. This is reported to provide more complete combustion of the air/fuel mixture by encouraging the flame kernel to pass through the split in the ground electrode 14 and into the combustion chamber. Conductive loaded resin-based materials of the present invention may be easily formed into shapes such as that of the split ground electrode 14.

Still referring to FIG. 1, in a third preferred embodiment of the present invention, both the center electrode 12 and the ground electrode 14 are formed of conductive loaded resin-based material. In this exemplary spark plug 10, the spark is generated based on the voltage differential between the ground electrode 14 and the center electrode 12. The shape of both electrodes may be modified so as to provide optimum spark characteristics and optimum wear. Likewise, the conductive powder(s) and/or conductive fiber(s) and base resin are selected to provide optimum electrical and thermal properties for the spark plug environment.

Referring again to FIG. 1, in another preferred embodiment the insulator 16 comprises a non-conductive resin-based material. As in the case of the center and grounding electrodes 12 and 14, the host resin for the insulator 16 of the present invention is selected from those resins which provide very high melting temperature. In the case of the insulator 16, however, the base resin is selected so as to provide both electrical isolation and high thermal capability. Further, the non-conductive resin-based insulator 16 may be used in combination with a conductive loaded resin-based center electrode 12 and/or with a conductive loaded resin-based ground electrode 14. Finally, all of these spark plug components may be molded into one unit. Thus, a lower cost, high performance spark plug can be manufactured.

Referring still to FIG. 1, as yet another preferred embodiment, the center electrode and/or the grounding electrode 12 and 14 of the spark plug device 10 comprise a conductive loaded ceramic material. Ceramic materials have an inherently high operating temperature. In the present invention, the above-described conductive fibers or conductive powders or any combination of conductive fibers and powders may be homogeneously mixed into a base ceramic material. This mixture is then exposed to very high temperatures and, optionally, to high pressure to densify and to bond the ceramic matrix. The resulting conductive loaded ceramic based material is doped with sufficient conductive material to provide a low resistivity.

Figure 7A:
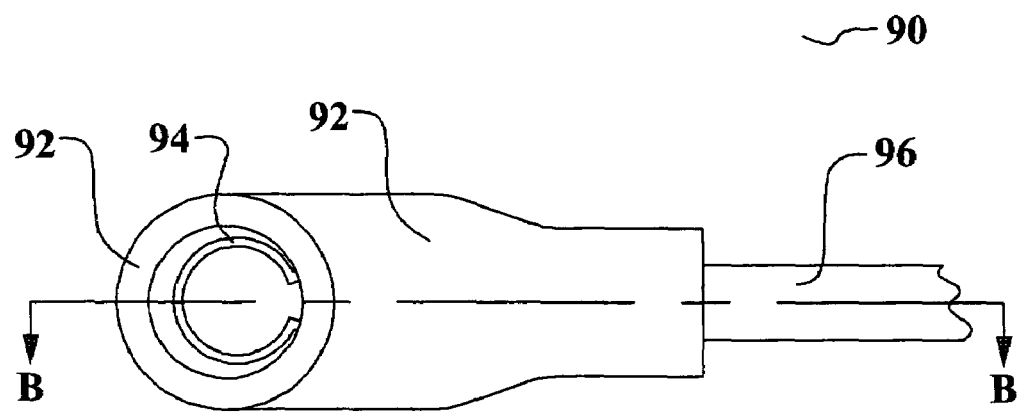
FIGS. 7a and 7b illustrate a second preferred embodiment of the present invention where spark plug cables or wires are formed of the conductive loaded resin-based material of the present invention.
Figure 7B:
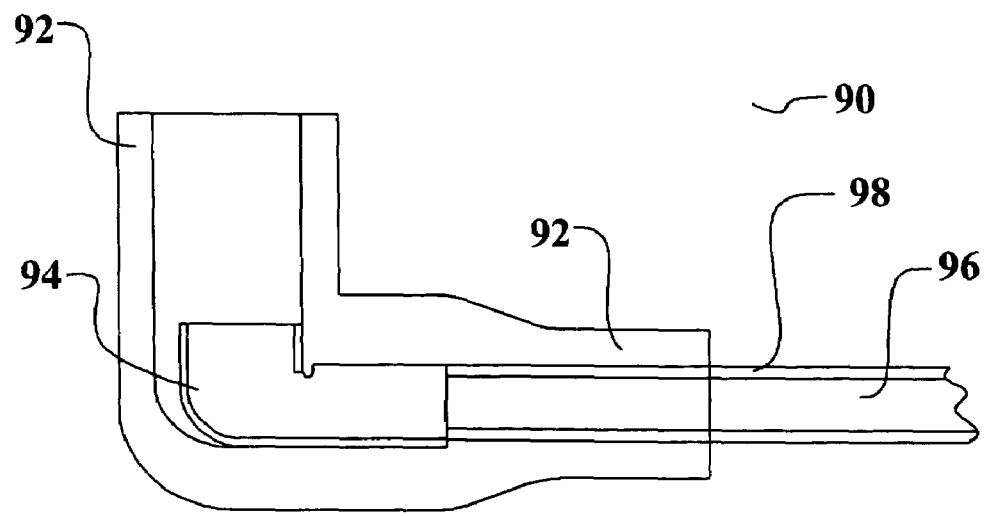

Referring now to FIG. 7a and 7b, an additional embodiment of the present invention is shown. In this case, spark plug cables or wires 10 are formed of the conductive loaded resin-based material of the present invention. Spark plug cables 90 are connected to the center electrode shown in FIG. 1 of each spark plug via the terminal posts shown in FIG. 1. Referring again to FIG. 7a and 7b, these spark plug cables 90 comprise terminals 94 and/or central conductors 96 comprising the conductive loaded resin-based material. An insulating layer or jacket 98 surrounds the cables. An insulating boot 92 surrounds the terminal 94. One preferred method of forming these spark plug cables is to mold the conductive loaded resin-based conductor 96 and terminal 94 together. Then the insulating jacket 98 is extruded over the conductive loaded resin-based conductor 96. The insulating boot 92 is then slid into position surrounding the terminal 94. As an alternative embodiment, the terminal 94 is fabricated of metal as is found in the prior art. In this alternate case, only the conductor 96 comprises conductive loaded resin-based material. The insulating jacket 98 is extruded over the molded conductor 96. The metal terminal 94 is attached by, for example, crimping, to the conductive loaded resin-based conductor 96. The insulating boot 92 is then slid into position surrounding the terminal 94. Finally, in another embodiment, the spark plug conductor and/or terminal 96 and 94 comprise the conductive loaded ceramic based material described above.

Figure 2:
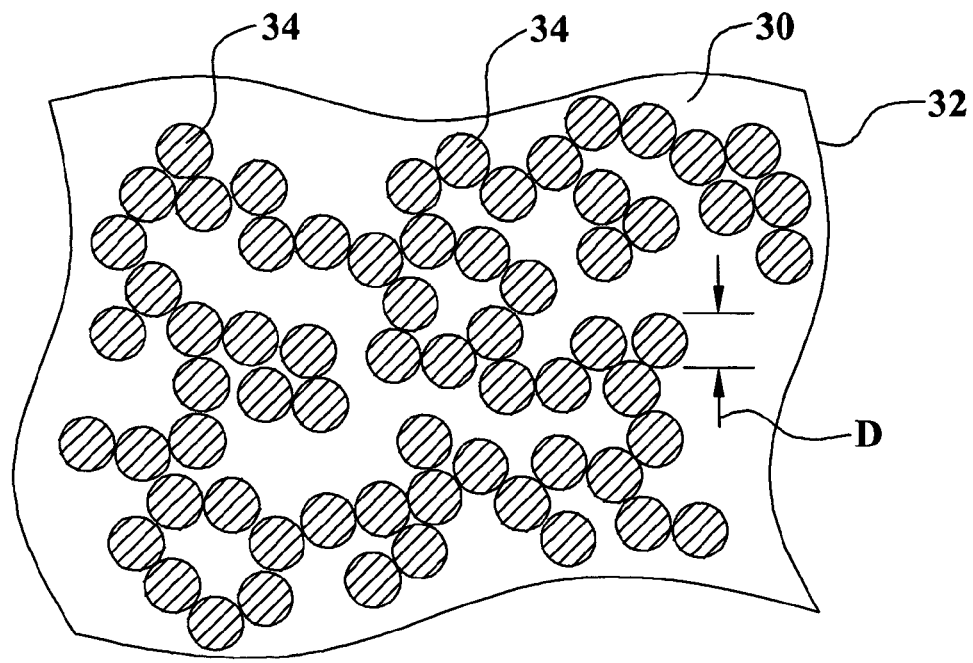
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) substantially homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
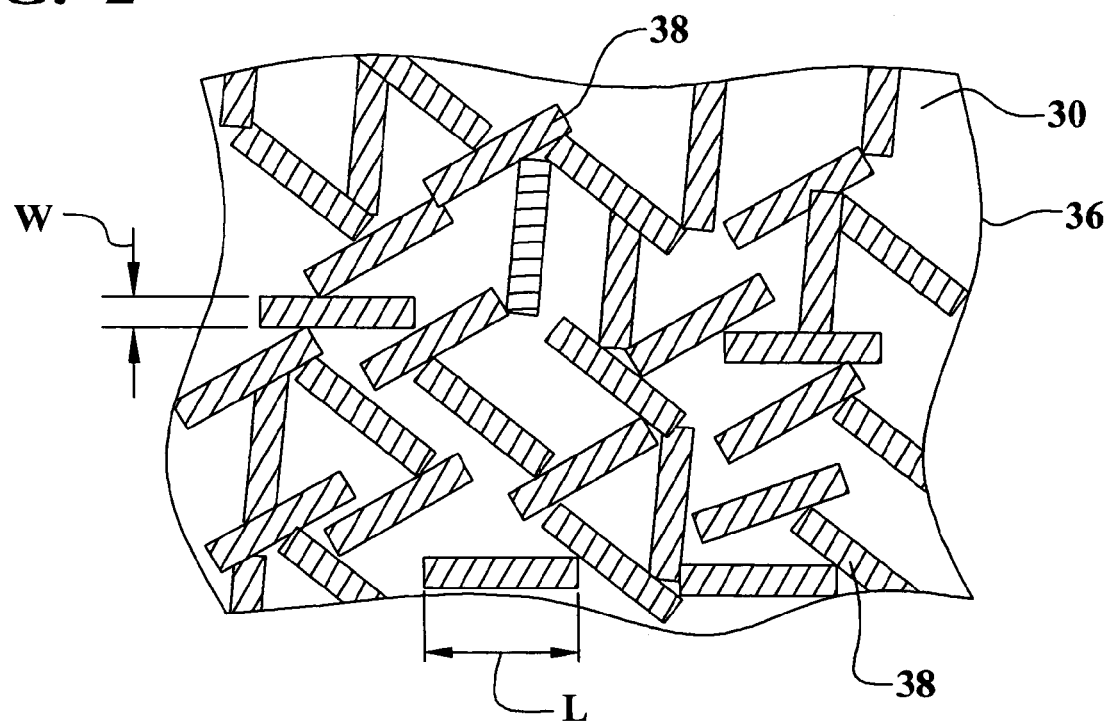
FIG. 3 illustrates a second preferred embodiment of a conductive loaded resin-based material wherein the conductive materials comprise micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The micron conductive fibers 38 may be metal fiber or metal plated fiber. Further, the metal plated fiber may be formed by plating metal onto a metal fiber or by plating metal onto a non-metal fiber. Exemplary metal fibers include, but are not limited to, stainless steel fiber, copper fiber, nickel fiber, silver fiber, aluminum fiber, or the like, or combinations thereof. Exemplary metal plating materials include, but are not limited to, copper, nickel, cobalt, silver, gold, palladium, platinum, ruthenium, and rhodium, and alloys of thereof. Any platable fiber may be used as the core for a non-metal fiber. Exemplary non-metal fibers include, but are not limited to, carbon, graphite, polyester, basalt, man-made and naturally-occurring materials, and the like. In addition, superconductor metals, such as titanium, nickel, niobium, and zirconium, and alloys of titanium, nickel, niobium, and zirconium may also be used as micron conductive fibers and/or as metal plating onto fibers in the present invention.

Figure 4:
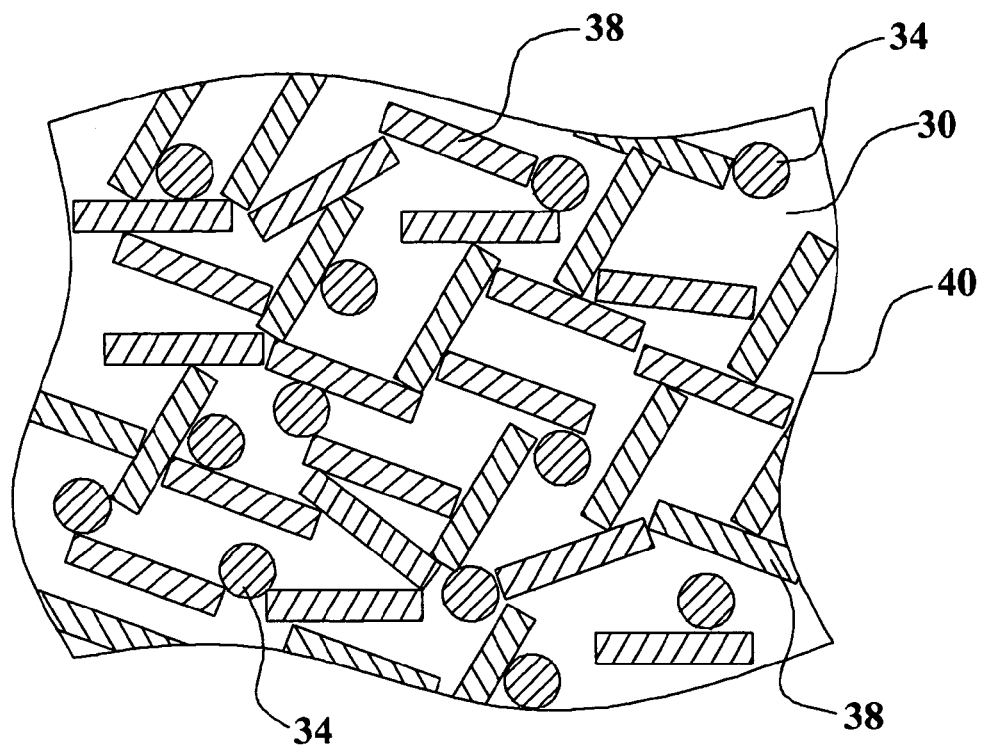
FIG. 4 illustrates a third preferred embodiment of a conductive loaded resin-based material wherein the conductive materials comprise both conductive powder and micron conductive fibers.

These conductor particles and/or fibers are substantially homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 6–12 micron in diameter and lengths of 4–6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 substantially homogenized together within the resin base 30 during a molding process.

Figure 5A:
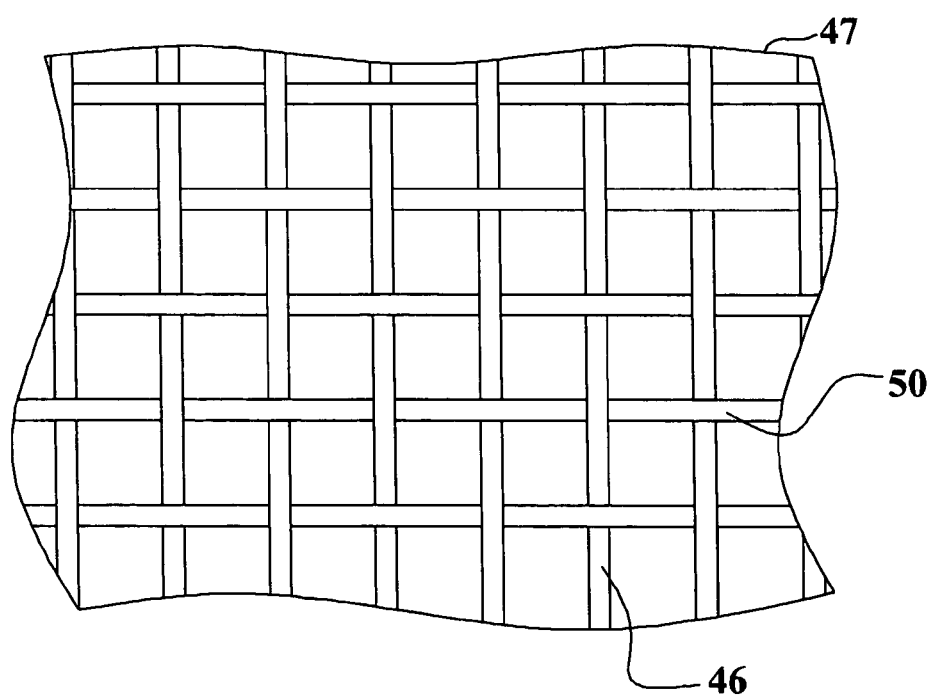

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Spark plug devices formed from conductive loaded resin-based materials can be formed or molded in a number of different ways including injection molding, extrusion, calendaring, or chemically induced molding or forming. FIG.

6a shows a simplified schematic diagram of an injection mold showing a lower portion 54 and upper portion 58 of the mold 50. Conductive loaded blended resin-based material is injected into the mold cavity 64 through an injection opening 60 and then the substantially homogenized conductive material cures by thermal reaction. The upper portion 58 and lower portion 54 of the mold are then separated or parted and the spark plug devices are removed.

FIG. 6b shows a simplified schematic diagram of an extruder 70 for forming spark plug devices using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. An effective spark plug device is achieved. A method to form a spark plug device is achieved. The spark plug device is molded of conductive loaded resin-based materials. The spark plug has improved electrical firing. The spark plug has an integrated center electrode resistor. The spark plug device is molded of conductive loaded resin-based material where the electrical or mechanical characteristics can be altered or the visual characteristics can be altered by forming a metal layer over the conductive loaded resin-based material. The conductive loaded resin-based material incorporates various forms of the material.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a spark plug device, said method comprising:
    providing a conductive loaded, resin-based material comprising conductive materials in a resin-based host; and
    molding said conductive loaded, resin-based material into a spark plug device comprising:
        a center electrode comprising said conductive loaded, resin-based material;
        a grounding electrode comprising said conductive loaded, resin-based material and separated at a first location from said center electrode by a gap; and
        an insulator separating said center electrode and said grounding electrode at a second location.

2. The method according to claim 1 wherein the percent by weight of said conductive materials is between about 20% and about 50% of the total weight of said conductive loaded resin-based material.

3. The method according to claim 1 wherein said conductive materials comprise micron conductive fiber.

4. The method according to claim 2 wherein said conductive materials further comprise conductive powder.

5. The method according to claim 1 wherein said conductive materials are metal.

6. The method according to claim 1 wherein said conductive materials are non-conductive materials with metal plating.

7. The method according to claim 1 wherein said step of molding comprises:
    injecting said conductive loaded, resin-based material into a mold;
    curing said conductive loaded, resinbased material; and
    removing said spark plug device from said mold.

8. The method according to claim 1 wherein said step of molding comprises:
    loading said conductive loaded, resin-based material into a chamber;
    extruding said conductive loaded, resin-based material out of said chamber through a shaping outlet; and
    curing said conductive loaded, resin-based material to form said spark plug device.

9. The method according to claim 1 wherein said resin-based material is a thermoplastic resin.

10. The method according to claim 1 wherein said resin-based material is a thermosetting resin.

11. A method to form a conductive fastening device, said method comprising:
    providing a conductive loaded, resin-based material comprising conductive materials in a resin-based host wherein the percent by weight of said conductive materials is between 20% and 40% of the total weight of said conductive loaded resin-based material; and
    molding said conductive loaded, resin-based material into a spark plug device comprising:
        a center electrode;
        a grounding electrode separated at a first location from said center electrode by a gap wherein said grounding electrode comprises said conductive loaded, resin-based material; and
        an insulator separating said center electrode and said grounding electrode at a second location.

12. The method according to claim 11 wherein said conductive materials are nickel plated carbon micron fiber, stainless steel micron fiber, copper micron fiber, silver micron fiber or combinations thereof.

13. The method according to claim 11 wherein said conductive materials comprise micron conductive fiber and conductive powder.

14. The method according to claim 13 wherein said conductive powder is nickel, copper, or silver.

15. The method according to claim 13 wherein said conductive powder is a non-metallic material with a metal plating.

16. The method according to claim 11 wherein said insulator comprises a resin-based material.

17. The method according to claim 11 wherein said grounding electrode further comprises an overlying metal layer.

18. The method according to claim 11 wherein said center electrode comprises said conductive loaded resin-based material.

19. The method according to claim 11 wherein said grounding electrode is further connected to a mechanical threading and wherein said mechanical threading comprises said conductive loaded resin-based material.

20. A method to form a conductive fastening device, said method comprising:
    providing a conductive loaded, resin-based material comprising micron conductive fiber in a resin-based host wherein the percent by weight of said micron conductive fiber is between 20% and 50% of the total weight of said conductive loaded resin-based material; and molding said conductive loaded, resin-based material into a conductive fastening device comprising:
- a center electrode comprising said conductive loaded, resin-based material;
- a grounding electrode separated at a first location from said center electrode by a gap; and
- an insulator comprising a resin-based material and separating said center electrode and said grounding electrode at a second location.

21. The method according to claim 20 wherein said micron conductive fiber is stainless steel.

22. The method according to claim 20 wherein said conductive loaded resin-based material further comprises conductive powder.

23. The method according to claim 20 wherein said micron conductive fiber has a diameter of between about 3 µm and about 12 µm and a length of between about 2 mm and about 14 mm.

* * * * *